(12) United States Patent
Claussen et al.

(10) Patent No.: US 10,739,390 B2
(45) Date of Patent: Aug. 11, 2020

(54) RESONANTLY-ENHANCED OPTICAL PHASE DETECTION OF RF SIGNALS IN LINBO3

(71) Applicant: SPAWAR Systems Center Pacific, San Diego, CA (US)

(72) Inventors: Stephanie Claussen, Denver, CO (US); Benjamin J. Taylor, Escondido, CA (US); Anna M. Leese de Escobar, Encinitas, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 283 days.

(21) Appl. No.: 16/037,567

(22) Filed: Jul. 17, 2018

(65) Prior Publication Data

US 2020/0025815 A1 Jan. 23, 2020

(51) Int. Cl.
*G01R 27/28* (2006.01)
*G02F 1/365* (2006.01)
*G02F 1/355* (2006.01)
*G02F 1/21* (2006.01)
*G01S 3/46* (2006.01)

(52) U.S. Cl.
CPC .......... *G01R 27/28* (2013.01); *G02F 1/3551* (2013.01); *G02F 1/365* (2013.01); *G01S 3/46* (2013.01); *G02F 2001/212* (2013.01); *G02F 2202/20* (2013.01); *G02F 2203/15* (2013.01)

(58) Field of Classification Search
CPC ....... G01R 27/28; G02F 1/3551; G02F 1/365; G02F 2202/20
See application file for complete search history.

(56) References Cited

U.S. PATENT DOCUMENTS 6,341,184 B1 * 1/2002 Ho .................. G02F 1/2257
385/1
7,181,093 B2 2/2007 Yap et al.
(Continued)

OTHER PUBLICATIONS

Cao et al., Angle-of-Arrival Measurement of a Microwave Signal Using Parallel Optical Delay Detector, IEEE Photonics Technology Letters, vol. 25, No. 19, Oct. 1, 2013 (Year: 2013).*
(Continued)

*Primary Examiner* — Daniel R Miller
(74) *Attorney, Agent, or Firm* — Naval Information Warfare Center, Pacific

(57) ABSTRACT

A system is provided for use with an optical input signal for detecting a phase difference between a first RF signal having a first phase and a second RF signal having a second phase. The system includes and optical waveguide, a first optical resonant cavity, a first RF receiver, a second optical resonant cavity and a second RF receiver. The optical resonant cavities include a non-linear electro-optical material. The first RF receiver affects the first non-linear electro-optical material of the first optical resonant cavity. The second RF receiver affects the second non-linear electro-optical material of first optical resonant cavity. The optical waveguide outputs an optical output signal based on the optical input signal as modified by the first optical resonant cavity as affected by the first RF receiver receiving the first RF signal and as modified by the second optical resonant cavity as affected by the second RF receiver.

7 Claims, 8 Drawing Sheets

(56) References Cited

U.S. PATENT DOCUMENTS

| | | | |
|---|---|---|---|
| 7,389,053 B1 | 6/2008 | Ilchenko et al. | |
| 7,805,026 B2 | 9/2010 | Gill | |
| 8,095,012 B1 | 1/2012 | Karras et al. | |
| 9,590,740 B1* | 3/2017 | Pace | H04B 10/503 |
| 9,787,405 B2 | 10/2017 | Baehr-Jones et al. | |
| 2009/0092350 A1* | 4/2009 | Gill | H04B 10/58 |
| | | | 385/3 |
| 2010/0033378 A1* | 2/2010 | Straatveit | G01S 3/46 |
| | | | 342/378 |
| 2018/0031946 A1* | 2/2018 | Middlebrook | G02B 6/29338 |

OTHER PUBLICATIONS

Barber et al., Spatial Spectral Interferometer for Frequency Resolved Angle of Arrival Estimation, Conference on Lasers and Electro-Optics 2010, OSA Technical Digest (CD), Optical Society of America, 2010 (Year: 2010).*

Van et al., "Optical Signal Processing Using Nonlinear Semiconductor Microring Resonators," IEEE J. Sel. Topics in Quant. Electron (2002).

Wooten et al., "A Review of Lithium Niobate Modulators for Fiber-Optic Communications Systems," IEEE J. Sel. Topics in Quant. Electron. (2000).

Lange et al., "Surface acoustic wave biosensors: a review." Analytical and bioanalytical chemistry 391.5: 1509-1519 (2008).

Wang et al., Fano-resonance-based Mach-Zehnder optical switch employing dual-bus coupled ring resonator as two-beam interferometer, Opt. Exp. 17: 7708-7716.

* cited by examiner

RESONANTLY-ENHANCED OPTICAL PHASE DETECTION OF RF SIGNALS IN LINBO3

FEDERALLY-SPONSORED RESEARCH AND DEVELOPMENT

Resonantly-Enhanced Optical Phase Detection of RF Signals in LiNbO$_3$ is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-5118; email ssc_pac_T2@navy.mil. Reference Navy Case Number 103,717.

BACKGROUND OF THE INVENTION

Embodiments of the invention relate to RF (radio frequency) signal detectors.

Conventional RF signal detectors may be used to detect a direction from which an RF signal is received. In some conventional systems an array of distinctly spaced RF receivers are disposed to receive an RF signal. Once received, the phase delay in the received signal between the two RF receivers is measured. With the measured phase difference and the known distance between the RF receivers, the direction from which the RF signal is received may be determined. These conventional systems are limited in their accuracy, as minute phase changes in a received RF signal are hard to detect with an electrical circuit.

What is needed is a system and method to accurately detect small phase changes represented by an RF signal received by an array of receivers.

SUMMARY OF THE INVENTION

The present disclosure system and method accurately detect small phase changes represented by an RF signal received by an array of receivers.

An aspect of the present disclosure is drawn to a system for use with an optical input signal for detecting a phase difference between a first RF signal having a first phase and a second RF signal having a second phase. The system includes an optical waveguide, a first optical resonant cavity, a first RF receiver, a second optical resonant cavity and a second RF receiver. The optical waveguide includes an optical input, an optical output and an optical transmission portion separating the optical input from the optical output. The optical input is arranged to receive the optical input signal. The first optical resonant cavity includes a first non-linear electro-optical material. The first RF receiver is arranged at a first location to receive the first RF signal and is operable to affect the first non-linear electro-optical material of the first optical resonant cavity. The second optical resonant cavity includes a second non-linear electro-optical material. The second RF receiver is arranged at a second location to receive the second RF signal and is operable to affect the second non-linear electro-optical material of the second optical resonant cavity. The optical waveguide is further operable to output an optical output signal based on the optical input signal as modified by the first optical resonant cavity as affected by the first RF receiver receiving the first RF signal and as modified by the second optical resonant cavity as affected by the second RF receiver. A difference between the optical output signal and the optical input signal is based on a difference between the first phase and the second phase. A difference between the first phase and the second phase is based on a difference between the first location and the second location.

BRIEF DESCRIPTION OF THE DRAWINGS

The accompanying drawings, which are incorporated in and form a part of the specification, illustrate example embodiments and, together with the description, serve to explain the principles of the system and method described herein. In the drawings:

FIGS. 2A-C illustrate an example system for detecting a phase difference between a first RF signal having a first phase and a second RF signal having a second phase, in accordance with aspects of the present disclosure, wherein FIG. 2A illustrates the system at a time $t_1$, FIG. 2B illustrates the system at time $t_2$ and FIG. 2C illustrates the system at a time $t_3$;

DETAILED DESCRIPTION OF THE EMBODIMENTS

Figure 1:
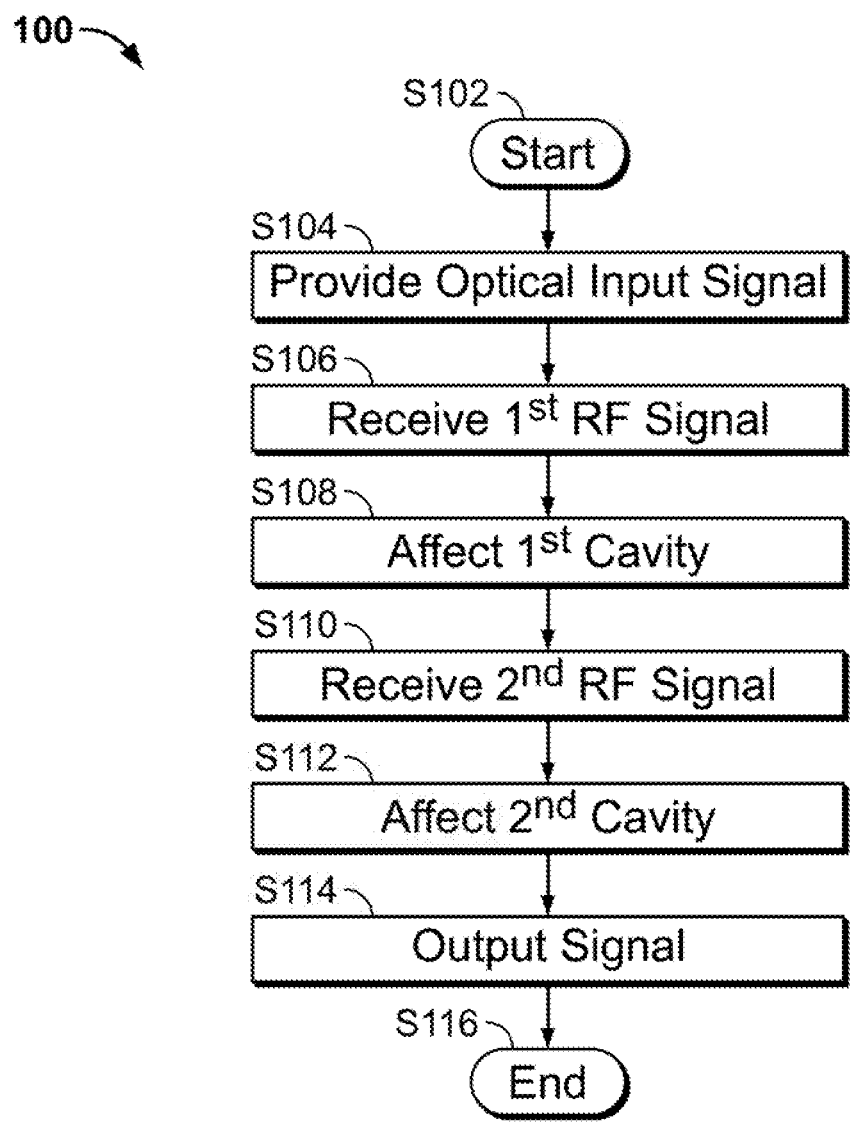
FIG. 1 illustrates an example method of detecting a phase difference between a first RF signal having a first phase and a second RF signal having a second phase in accordance with aspects of the present disclosure.

Nonlinear electro-optic materials such as LiNbO$_3$ can be effectively used as optical modulators or sensors. There is current interest in integrating LiNbO$_3$-compatible devices with radio frequency (RF) circuits to detect small differences in phase between two signals, which could be applied to signal-processing and range-finding problems. Due to the relatively week nonlinear Pockels effect in LiNbO$_3$, the achievable refractive index change achieved in the material when an electric field is applied is small, and thus devices required either very large applied voltages (on the order of 100V, for example, to achieve a significant change in phase for destructive interference between the two arms of an interferometer) or very long interferometer lengths to achieve sufficient interference.

A system and method in accordance with aspects of the present disclosure provide high accuracy and resolution of the phase difference between RF signals injected into the system at two input terminals. A specific function of a system and method in accordance with aspects of the present disclosure provides direction finding of RF signals on a sub ¼-wavelength baseline.

A system and method in accordance with aspects of the present disclosure accomplish this by accurately measuring the phase difference of an RF signal received at two locations separated by sub-¼ wavelength distances. Resonant cavities are used to enhance a nonlinear electro-optical effect, reducing the required switching power and size of the system. Optical resonators (such as ring resonators) may be used to enhance the interaction between two optical signals, resulting in a lower power and smaller optical system that can accurately detect small phase differences in the signals.

A system in accordance with aspects of the present disclosure may be operated at ambient temperatures or cooled to cryogenic temperatures.

In accordance with aspects of the present disclosure, resonant cavities may be used to enhance the nonlinear electro-optical effect. Optical resonators enhance the interaction between two optical signals converted from RF sources, resulting in a lower power and small optical device that can accurately detect phase differences in the two RF signals.

Disclosed herein are three non-limiting example embodiments for integrating optical cavities into an electro-optic phase detector system.

The first non-limiting example embodiment, described in greater detail below with reference to FIG. 3, includes two active ring resonators on a shared bus waveguide. Two applied RF signals, one on each resonator, serve to shift the resonant frequency of the ring. Based on the resonance of each ring, an output optical signal detected at a photodetector would reflect the phase difference between the two RF signals.

A second non-limiting example embodiment, described in greater detail below with reference to FIG. 4, involves the integration with a Mach-Zehnder interferometer (MZI), and is referred to as a cross-ring resonator. Due to the asymmetric output that can be generated in such a configuration, this design has the potential for very easy recovery of the phase offset between the two applied RF signals.

A third non-limiting example embodiment, described in greater detail below with reference to FIG. 6, offers another way of integrating ring resonators and a MZI. In this example embodiment, a ring resonator is integrated onto each arm of the MZI. A benefit of this design is that it provides three output signals, a comparison of which may be used for easy recovery of phase information. Again, the two RF signals for which there is an aim to determine the phase difference between are applied to the two ring resonators. These RF signals will act to selectively couple light from their respective waveguides to the main MZI and then interfere with the optical signals in the two MZI arms at the output of the MZI, amplifying the phase difference between the RF signals.

As mentioned above, in a first example embodiment, two active ring resonators, with an RF signal applied to each ring ($V_{RF1}$ and $V_{RF2}$), serve to selectively filter light of a specific wavelength (dependent on the resonant wavelength of the ring and the applied voltage). This will cause the signal at the output to reflect the phases of the two RF signals, providing a way to determine the phase difference between the two signals. This will be further described in greater detail with reference to FIGS. 1-3.

FIG. 1 illustrates an example method 100 of detecting a phase difference between a first RF signal having a first phase and a second RF signal having a second phase, in accordance with aspects of the present disclosure.

As shown in the figure, method 100 starts (S102) and an optical input signal is provided (S104). This will be described in greater detail with reference to FIGS. 2A-C.

Figure 2A:
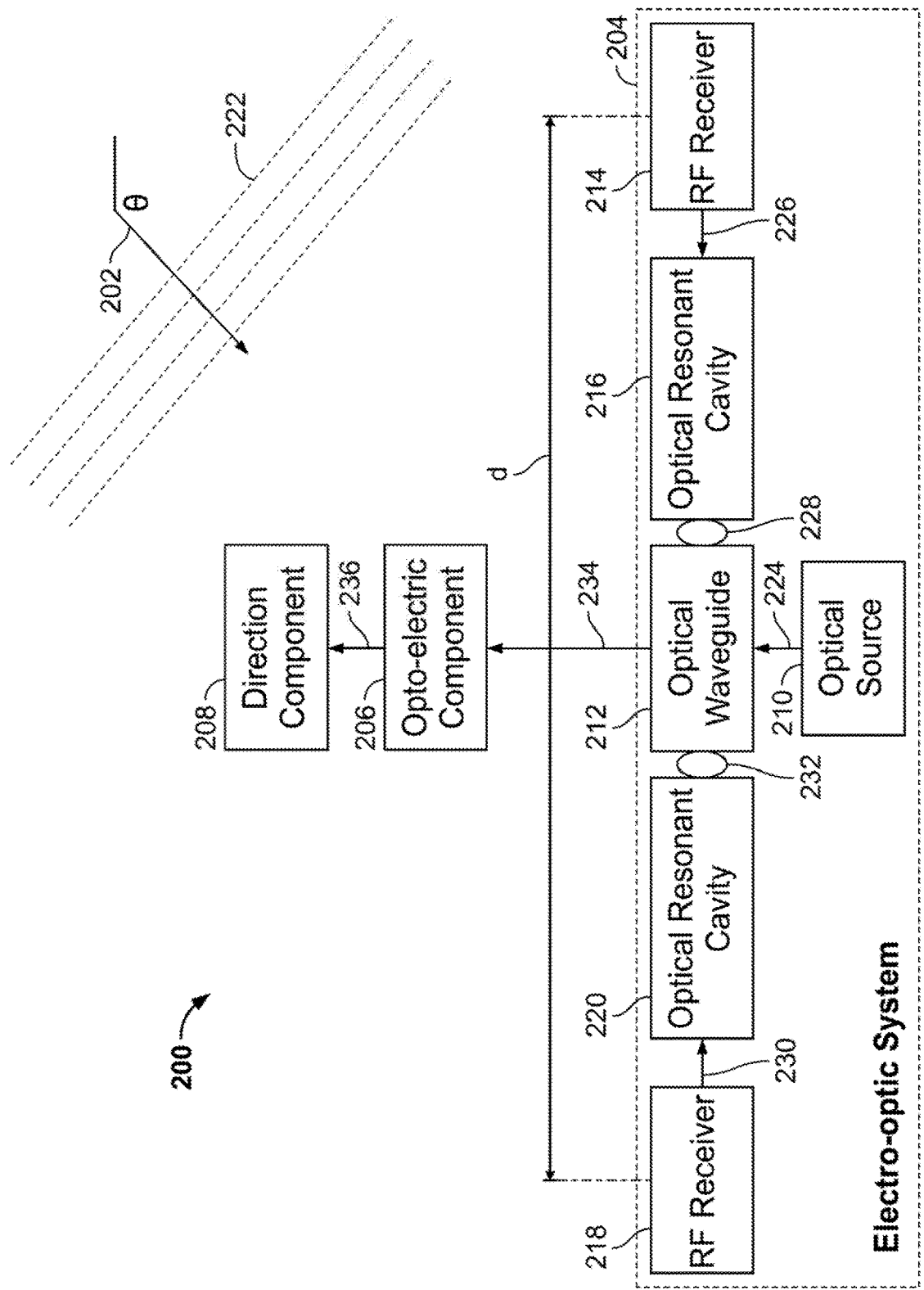
Figure 2B:
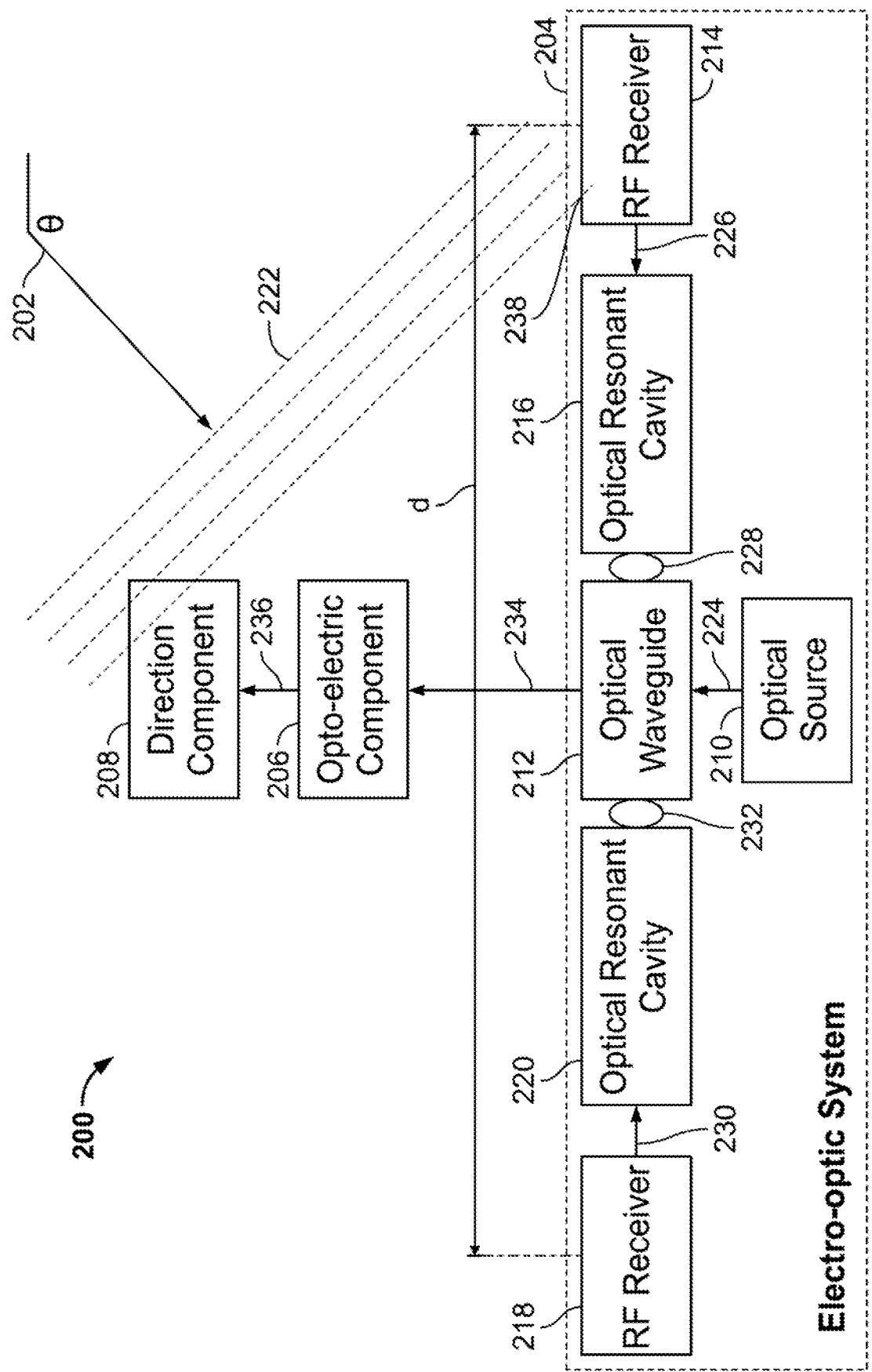
Figure 2C:
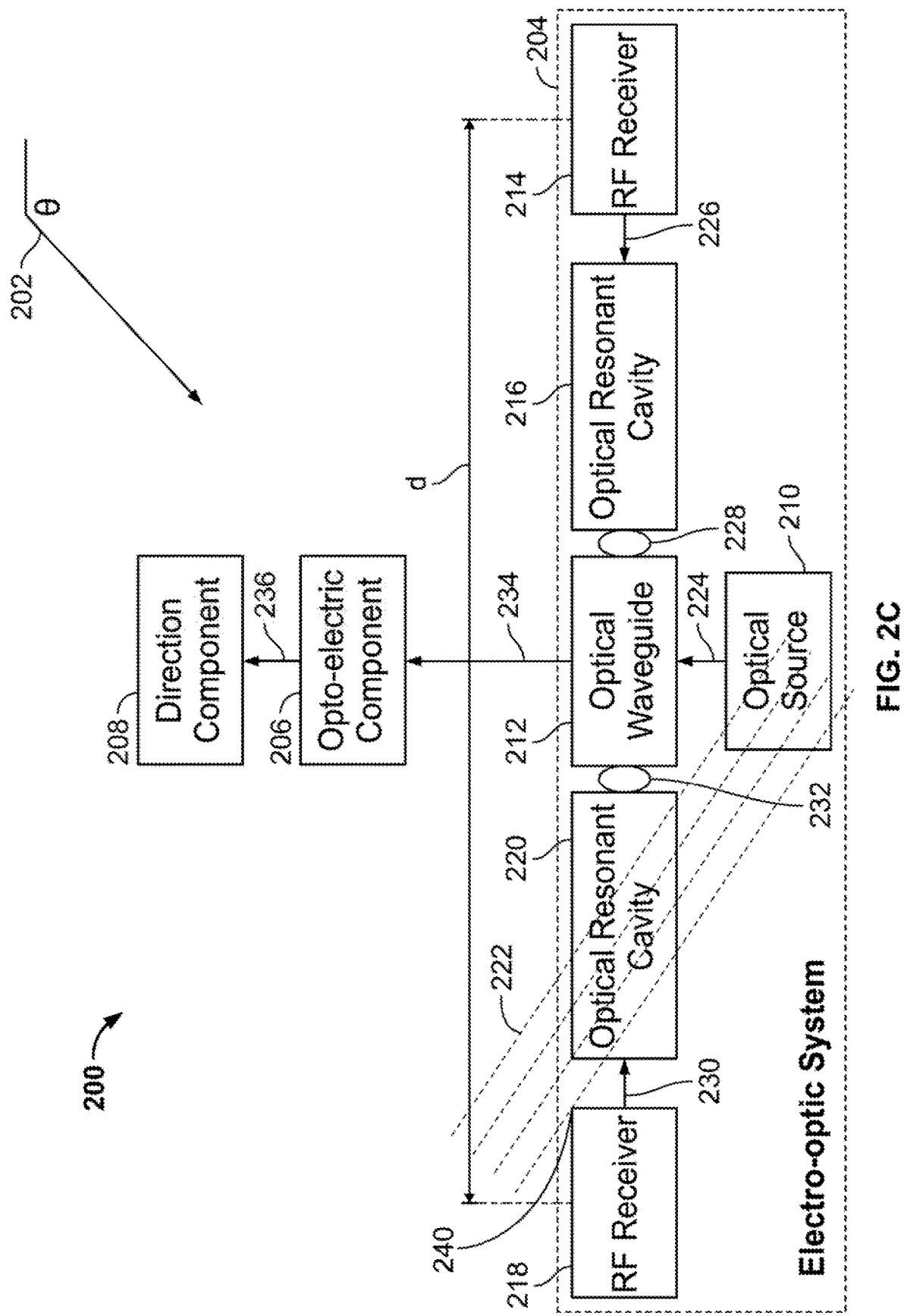

FIGS. 2A-C illustrate an example system 200 for detecting an RF signal 202 traveling in a direction indicated by the arrow at an angle θ by detecting a phase difference between a first RF signal having a first phase and a second RF signal having a second phase, in accordance with aspects of the present disclosure, wherein FIG. 2A illustrates system 200 at a time $t_1$, FIG. 2B illustrates system 200 at time $t_2$ and FIG. 2C illustrates system 200 at a time $t_3$.

As shown in FIG. 2A, system 200 includes an electro-optic system 204, an opto-electric component 206 and a direction component 208. In this example, electro-optic system 204, opto-electric component 206 and direction component 208 are illustrated as individual devices. However, in some embodiments, at least two of electro-optic system 204, opto-electric component 206 and direction component 208 may be combined as a unitary device.

Further, in some embodiments, direction component 208 may be implemented as a computer having tangible computer-readable media for carrying or having computer-executable instructions or data structures stored thereon. Such tangible computer-readable media can be any available media that can be accessed by a general purpose or special purpose computer. Non-limiting examples of tangible computer-readable media include physical storage and/or memory media such as RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. For information transferred or provided over a network or another communications connection (either hardwired, wireless, or a combination of hardwired or wireless) to a computer, the computer may properly view the connection as a computer-readable medium. Thus, any such connection may be properly termed a computer-readable medium. Combinations of the above should also be included within the scope of computer-readable media.

Electro-optic system 204 is arranged to receive RF signal 202 and to output an output optical signal 234 to opto-electric component 206. Opto-electric component 206 is arranged to output an electric signal 236, based on optical output signal 234, to direction component 208.

Electro-optic system 204 includes an optical source 210, an optical waveguide 212, a radio frequency (RF) receiver 214, an optical resonant cavity 216, an RF receiver 218 and an optical resonant cavity 220. In this example, optical source 210, optical waveguide 212, RF receiver 214, optical resonant cavity 216, RF receiver 218 and optical resonant cavity 220 are illustrated as individual devices. However, in some embodiments, at least two of optical source 210, optical waveguide 212, RF receiver 214, optical resonant cavity 216, RF receiver 218 and optical resonant cavity 220 may be combined as a unitary device.

Optical source 210 is arranged to provide an optical input signal 224 to optical waveguide 212. RF receiver 214 is arranged to provide an affecting signal 226 to optical resonant cavity 216. Optical resonant cavity 216 is arranged to optically couple with optical waveguide 212 as shown by ellipse 228. RF receiver 218 is arranged to provide an affecting signal 230 to optical resonant cavity 220. Optical resonant cavity 220 is arranged to optically couple with optical waveguide 212 as shown by ellipse 232. Optical waveguide 212 is arranged to output optical output signal 234 to opto-electric component 206.

In operation, optical source 210 provides optical input signal 224 to optical waveguide 212. Optical source 210 may be any known optical source, a non-limiting example of which includes a light emitting diode that provides a light having a predetermined frequency. For purposes of discussion, at this point in time, RF signal 202 is approaching system 200 from an angle θ. An example set of wave fronts 222 is illustrated as being distant from system 200.

Returning to FIG. 1, after the optical input signal is provided (S104), the first RF signal is received (S106). For example, as shown in FIG. 2B, at time $t_2$, RF signal 202 has traveled so as to contact RF receiver 214, wherein wave fronts 222 contact at point 238. The operation of RF receiver 214, an example embodiment of optical resonant cavity 216 and an example embodiment of optical waveguide 212 will now be described with reference to FIG. 3.

Figure 3:
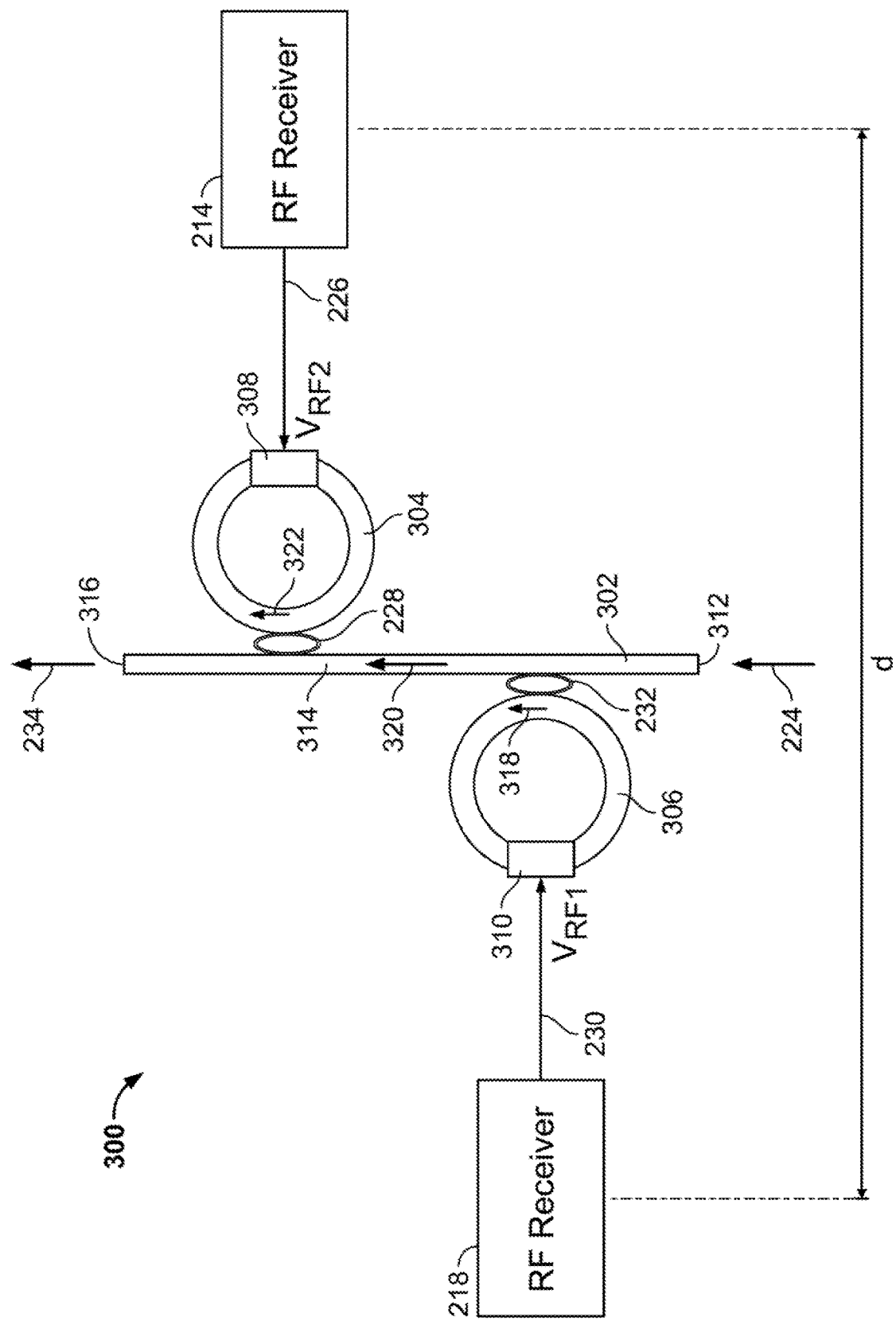
FIG. 3 illustrates a detailed view of an example portion of an example embodiment of the system of FIGS. 2A-C.

FIG. 3 illustrates a detailed view of an example portion 300 of an example embodiment of system 200.

As shown in the figure, portion 300 includes RF receiver 214, RF receiver 218, an optical waveguide 302, an optical resonant cavity 304, an optical resonant cavity 306, an electrode 308 and an electrode 310.

RF receiver 214 and RF receiver 218 may each be any known system or device that is operable to detect an RF signal, non-limiting examples of which includes antennas or arrays, for example an electromagnetic signal array disclosed in U.S. patent application Ser. No. 15/604,035 filed May 24, 2017 as Navy Case No. 103416, and titled "Devices and Methods for Electromagnetic Signal Phase Discrimination Using SQUID Arrays and Electro-Optical Materials."

RF receiver 214 is arranged to provide affecting signal 226 to electrode 308. Electrode 308 is disposed on optical resonant cavity 304. Optical resonant cavity 304 is arranged to optically couple with optical waveguide 302 as shown by ellipse 228.

RF receiver 218 is arranged to provide affecting signal 230 to electrode 310. Electrode 310 is disposed on optical resonant cavity 306. Optical resonant cavity 306 is arranged to optically couple with optical waveguide 302 as shown by ellipse 232.

Optical waveguide 302 includes an optical input 312, an optical transmission portion 314 and an optical output 316, where optical transmission portion 314 is disposed between optical input 312 and optical output 316.

In operation, RF receiver 214 detects RF signal 202 and outputs affecting signal 226. In one example, affecting signal 226 is a voltage $V_{RF2}$.

Returning to FIG. 1, after the first RF signal is received (S106), the first cavity is affected (S108). For example, as shown in FIG. 2B, optical resonant cavity 216 is affected by affecting signal 226. This will be described in greater detail with respect to FIG. 3.

As shown in FIG. 3, each of optical resonant cavities 304 and 306 has a material therein in which an optical property is controllable. Any optical material may be used in accordance with aspects of the present disclosure that is controllably variable. Non-limiting examples of such optical materials include electro-optic materials and magneto-optic materials. Further, in some embodiments, optical resonant cavity 304 has a controllably variable optical material that is different from the controllably variable optical material within optical resonant cavity 306.

In an example embodiment, each of optical resonant cavities 304 and 306 has a non-linear electro-optical material therein. In a specific working example embodiment, each of optical resonant cavities 304 and 306 have $LiNbO_3$, wherein the achievable refractive index change is achieved in the material when an electric field is applied in accordance with the Pockels effect.

Accordingly, in the specific working example embodiment, RF receiver 214 arranged at a first location to receive RF signal 202 and output provide affecting signal 226 to electrode 308. Here, affecting signal 226 takes the form of voltage $V_{RF2}$ on electrode 308, which affects the refractive index of the $LiNbO_3$ within optical resonant cavity 304.

Returning to FIG. 1, after the first cavity is affected (S108), the second RF signal is received (S110). For example, as shown in FIG. 2C, at time $t_3$, RF signal 202 has traveled so as to contact RF receiver 218, wherein wave fronts 222 contact at point 240. The operation of RF receiver 218, example embodiment of optical resonant cavity 216 and example embodiment of optical waveguide 212 will now be described with reference to FIG. 3.

In operation, RF receiver 218 detects RF signal 202 and outputs affecting signal 230. In this example, affecting signal 230 is a voltage $V_{RF1}$.

Returning to FIG. 1, after the second RF signal is received (S110), the second cavity is affected (S112). For example, as shown in FIG. 2C, optical resonant cavity 220 is affected by affecting signal 230. This will be described in greater detail with respect to FIG. 3.

In the specific working example embodiment, RF receiver 218 is arranged at a second location to receive RF signal 202 and provide affecting signal 230 to electrode 310. More specifically, RF receiver 218 is provided at a known, predetermined distance d from RF receiver 214. This known, predetermined distance that separates RF receiver 214 from RF receiver 218 will enable a system in accordance with the present disclosure to accurately determine a direction of RF signal 202.

Affecting signal 230 takes the form of voltage $V_{RF1}$ on electrode 310, which affects the refractive index of the $LiNbO_3$ within optical resonant cavity 306.

Returning to FIG. 1, after the second cavity is affected (S112), a signal is outputted (S114). For example, as shown in FIG. 2C, optical input signal 224 provided by optical source 210 to optical waveguide 212 is modified by optical resonant cavity 216 as affected by RF receiver 214 receiving RF signal 202 at time $t_1$ and as modified by optical resonant cavity 220 as affected by RF receiver 218 receiving RF signal 202 at time $t_2$. Optical waveguide 212 then outputs output optical signal 234 to opto-electric component 206. This will be described in greater detail with reference to FIG. 3.

As shown in FIG. 3, optical waveguide 302 receives optical input signal 224 at optical input 312. As optical input signal 224 transmits through optical transmission portion 314, optical input signal 224 couples with optical resonant cavity 306. Optical resonant cavity 306 amplifies and modifies optical input signal 224 based on the changes as affected by $V_{RF1}$. This amplified and modified portion of optical input signal 224 then recouples with optical transmission portion 314 and interferes with optical input signal 224 within optical transmission portion 314 to generate an amplified modified optical input signal 320.

As amplified modified optical input signal 320 transmits through optical transmission portion 314, amplified modified optical input signal 320 couples with optical resonant cavity 304. Optical resonant cavity 304 amplifies and modifies amplified modified optical input signal 320 based on the changes as affected by $V_{RF2}$. This amplified and modified portion of amplified modified optical input signal 320 then recouples with optical transmission portion 314 and interferes with amplified modified optical input signal 320 within optical transmission portion 314 to generate output optical signal 234.

Returning to FIG. 1, after a signal is outputted (S114), method 100 stops (S116).

Returning to FIG. 2C, opto-electric component 206 may be any device or system that is able to output electrical signal 236 based on output optical signal 234. A non-limiting example of opto-electric component 206 includes a photodetector that is able to convert output optical signal 234 into electrical signal 236.

Direction component 208 may be any device or system that is able to determine a direction of RF signal 202 based on electrical signal 236. Returning to FIG. 3, output optical signal 234 is based on a twice modified version of optical input signal 224. In particular, optical input signal 224 is modified by the light that is amplified and modified by the LiNbO$_3$ within optical resonant cavity 306 and is modified by the light that is amplified and modified by the LiNbO$_3$ within optical resonant cavity 304. More specifically, in this example wherein RF signal 202 contacts RF receiver 214 first, optical input signal 224 is modified by the light that is amplified and modified by the LiNbO$_3$ within optical resonant cavity 304 and then is modified by the light that is amplified and modified by the LiNbO$_3$ within optical resonant cavity 306.

The difference in the times of the modification manifests as a phase change in the optical signal within optical transmission portion 314. Therefore, a difference in the phase of optical output signal 234 and optical input signal 224 is based on a difference between when RF receiver 214 receives RF signal 202 (for example, as shown in FIG. 2B) and when RF receiver 218 receives RF signal 202 (for example, as shown in FIG. 2C). Accordingly, a difference in the phase of optical output signal 234 and optical input signal 224 is based on a difference between the location of RF receiver 214 and RF receiver 218, i.e., distanced.

Returning to FIG. 2C, direction component 208 is able to determine a direction, θ, from which RF signal 202 has been received based on electrical signal 236. In particular, with the known distance, d, between RF receiver 218 and RF receiver 214 and the phase information within electric signal 236, direction component 208 may determine θ in any known manner.

A major benefit of a system in accordance with the present disclosure is the use of the resonating cavities having the electro-optic material therein. Detecting an RF signal with only two receivers that are separated at a known distance is well known. However, such a rudimentary system is limited in its precision. By working in the optical realm, a system in accordance with the present disclosure is much more precise, as a mere change in phase of an optical signal is precisely measurable. More importantly, by including the resonators, an optically amplified signal is used, which greatly increases the sensitivity and thus measurability of a received signal.

It should be noted that the example embodiment discussed above with reference to FIG. 3 is a non-limiting example.

In another example embodiment, a cross-ring resonator may be integrated between the two arms of a Mach-Zehnder interferometer (MZI). Such a design creates an asymmetric phase response at the output, which may be used to recover the phase difference between the two applied RF voltage signals. This will be described in greater detail with reference to FIG. 4.

Figure 4:
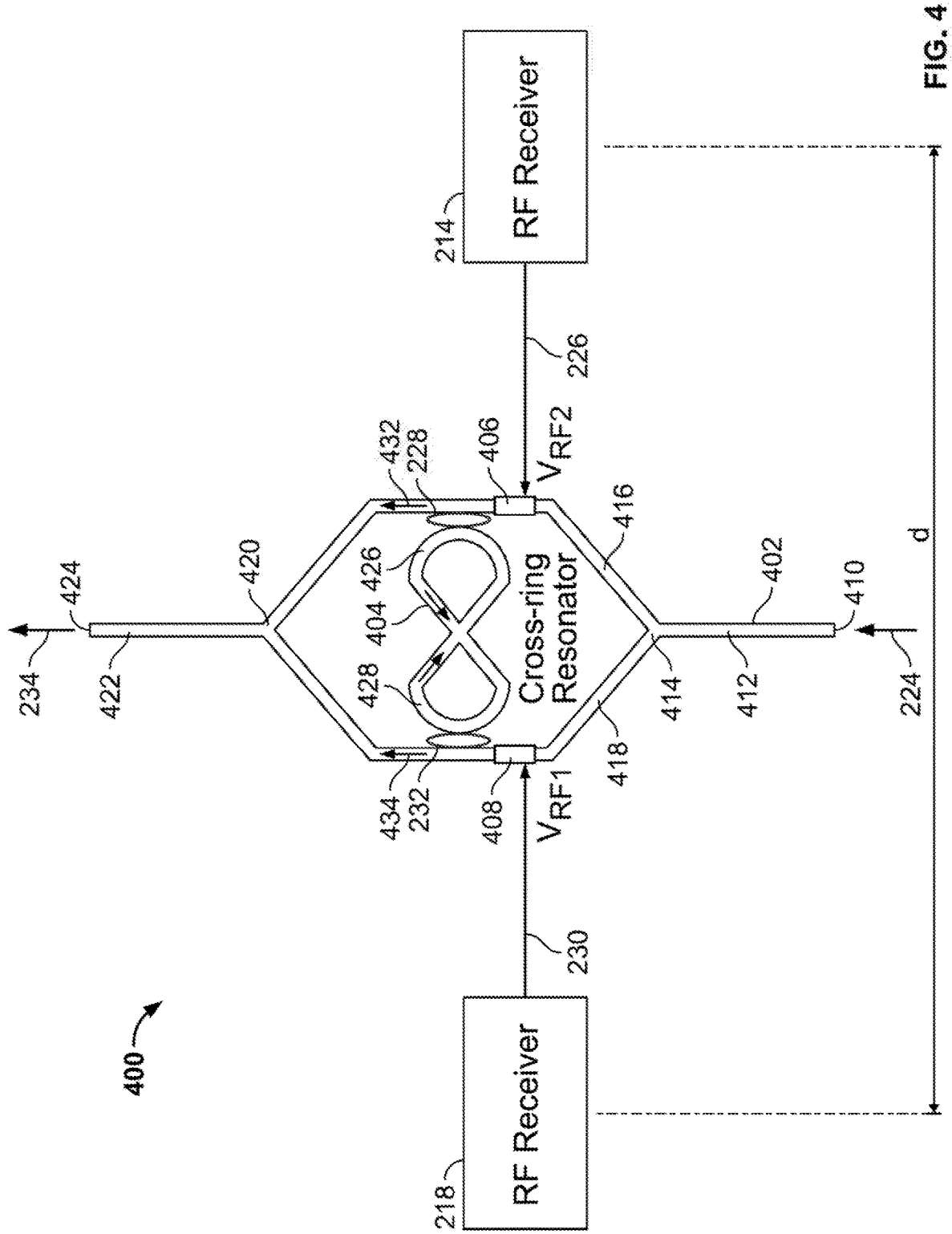
FIG. 4 illustrates a detailed view of an example portion of another example embodiment of the system of FIGS. 2A-C.

FIG. 4 illustrates a detailed view of an example portion 400 of another example embodiment of system 200.

As shown in the figure, portion 400 includes RF receiver 214, RF receiver 218, an optical waveguide 402, an optical resonant cavity 404, an electrode 406 and an electrode 408.

Optical waveguide 402 includes an optical input 410, an optical transmission portion 412, a beam splitter 414, a leg 416, a leg 418, a beam combiner 420, an optical transmission portion 422 and an optical output 424. Optical transmission portion 412 is disposed between optical input 410 and beam splitter 414. Leg 416 is disposed between beam combiner 420 and beam splitter 414. Leg 418 is disposed between beam combiner 420 and beam splitter 414. Optical transmission portion 422 is disposed between optical output 424 and beam combiner 420.

Optical resonant cavity 404 includes an optical resonant cavity portion 426 and an optical resonant cavity portion 428 arranged as a cross-ring resonator disposed between leg 416 and leg 418.

Each of optical resonant cavity portions 426 and 428 have a material therein in which an optical property is controllable. Any optical material may be used in accordance with aspects of the present disclosure that is controllably variable. Non-limiting examples of such optical materials include electro-optic materials and magneto-optic materials. Further, in some embodiments, optical resonant cavity portion 426 has controllably variable optical material that is different from the controllably variable optical material within optical resonant cavity portion 428.

In an example embodiment, each of optical resonant cavity portions 426 and 428 have a non-linear electro-optical material therein. In a specific working example embodiment, each of optical resonant cavity portions 426 and 428 have LiNbO$_3$, wherein the achievable refractive index change is achieved in the material when an electric field is applied in accordance with the Pockels effect. Further, in this specific working example embodiment, optical resonant cavity portion 426 is different in size than optical resonant cavity portion 428, i.e., optical resonant cavity 404 is asymmetric, in order to generate an increased phase difference in optical output signal 234.

RF receiver 214 is arranged to provide affecting signal 226 to electrode 406. Electrode 406 is disposed on leg 416. Optical resonant cavity portion 426 is arranged to optically couple with leg 416 as shown by ellipse 228.

RF receiver 218 is arranged to provide affecting signal 230 to electrode 408. Electrode 408 is disposed on leg 418. Optical resonant cavity portion 428 is arranged to optically couple with leg 418 as shown by ellipse 232.

The structure of example portion 400 is different than the structure of example portion 300 discussed above with reference to FIG. 3. However, the overall output of example portion 400 provides an optical signal that enables a determination of a direction of RF signal 202 that is similar in function to example portion 300.

In operation, optical source 210 provides optical input signal 224 to optical waveguide 402. After the optical input signal is provided, the first RF signal is received in a manner discussed above with reference to FIG. 2B. As shown in FIG. 4, in operation, RF receiver 214 detects RF signal 202 and outputs affecting signal 226. In one example, affecting signal 226 is a voltage $V_{RF2}$.

After the first RF signal is received, the first cavity is affected. For example, as shown in FIG. 2B, optical resonant cavity 216 is affected by affecting signal 226. This will be described in greater detail with reference to FIG. 4.

As shown in FIG. 4, optical input signal 224 enters optical waveguide 402 at optical input 410, transmits through optical transmission portion 412 and is split at beam splitter 414. A portion of optical input signal 224 transmits along leg 416, whereas another portion of optical input signal 224 transmits along leg 418.

RF receiver 214 arranged at a first location to receive RF signal 202 and provide affecting signal 226 to electrode 406. Here, affecting signal 226 takes the form of voltage $V_{RF2}$ on electrode 406, which affects the refractive index of the LiNbO$_3$ within optical resonant cavity portion 426.

After the first cavity portion is affected, the second RF signal is received. For example, as shown in FIG. 2C, at time $t_3$, RF signal 202 has traveled so as to contact RF receiver 218, wherein wave fronts 222 contact at point 240.

As shown in FIG. 4, in operation, RF receiver 218 detects RF signal 202 and outputs affecting signal 230. In this example, affecting signal 230 is a voltage $V_{RF1}$.

After the second RF signal is received, the second cavity is affected. For example, as shown in FIG. 2C, optical resonant cavity 220 is affected by affecting signal 230.

As shown in FIG. 4, RF receiver 218 is arranged at a second location to receive RF signal 202 and provide affecting signal 230 to electrode 408. Again, RF receiver 218 is provided at a known, predetermined distance d from RF receiver 214. This known, predetermined distance that separates RF receiver 214 from RF receiver 218 will enable a system in accordance with the present disclosure to accurately determine a direction of RF signal 202.

Affecting signal 230 takes the form of voltage $V_{RF1}$ on electrode 408, which affects the refractive index of the $LiNbO_3$ within optical resonant cavity portion 428.

After the second cavity is affected, a signal is outputted. As shown in FIG. 4, leg 416 receives the portion of optical input signal 224 and couples with optical resonant cavity portion 426.

Optical resonant cavity portion 426 then recouples with leg 416 and interferes with the portion of optical input signal 224 within leg 416 to generate a modified signal 432 based on the changes as affected by $V_{RF2}$. Modified signal 432 is then transmitted to beam combiner 420.

Similarly, leg 418 receives a portion of optical input signal 224 and couples with optical resonant cavity portion 428. Optical resonant cavity portion 428 then recouples with leg 418 and interferes with the portion of optical input signal 224 within leg 418 to generate a modified signal 434 based on the changes as affected by $V_{RF1}$.

Beam combiner 420 combines modified signal 432 with modified signal 434 to generate optical output signal 234, which is transmitted through optical transmission portion 422 and out optical output 424 to opto-electric component 206.

In another example embodiment, a ring-resonator may be integrated into each arm of a MZI, and serve to selectively couple optical signals between a bus waveguide and one of the arms of the MZI. Such an example embodiment may provide a way of enhancing the phase difference between the two RF signals. This will be further described with reference to FIGS. 5-6.

Figure 5:
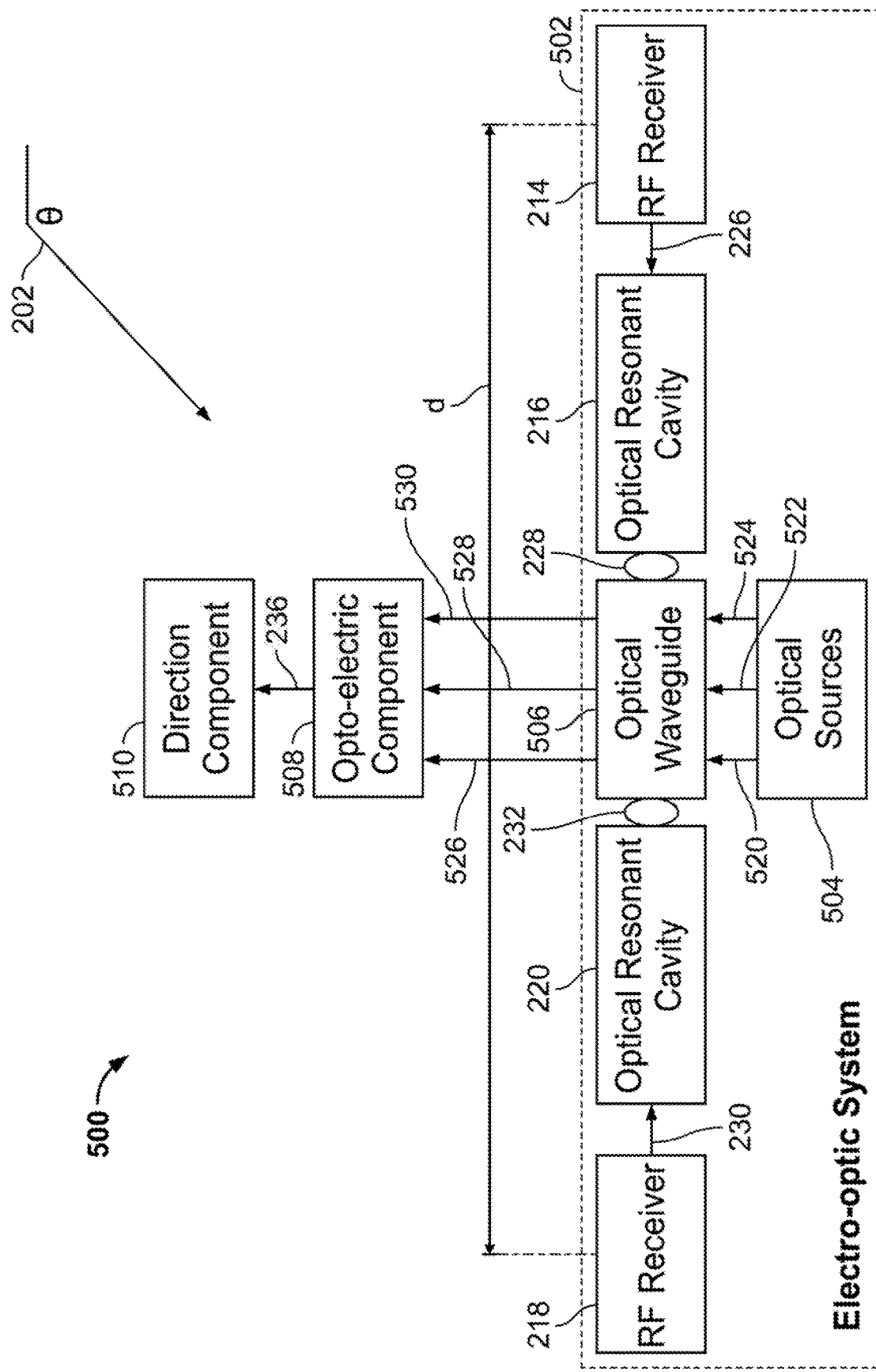
FIG. 5 illustrate another example system for detecting a phase difference between a first RF signal having a first phase and a second RF signal having a second phase, in accordance with aspects of the present disclosure.

FIG. 5 illustrates another example system 500 for detecting a phase difference between a first RF signal having a first phase and a second RF signal having a second phase, in accordance with aspects of the present disclosure.

System 500 is similar to system 200 discussed above with reference to FIGS. 2A-C, but differs in that optical source 210, optical waveguide 212, opto-electric component 206 and direction component 208 of system 200 have been replaced with optical sources 504, an optical waveguide 506, an opto-electric component 508 and a direction component 510, respectively. Further, electro-optic system 200 of FIG. 2 corresponds to electro-optic system 502 in FIG. 5.

As shown in FIG. 5, electro-optic system 502, opto-electric component 508 and direction component 510 are illustrated as individual devices. However, in some embodiments, at least two of electro-optic system 502, opto-electric component 508 and direction component 510 may be combined as a unitary device.

Further, in some embodiments, direction component 510 may be implemented as a computer having tangible computer-readable media for carrying or having computer-executable instructions or data structures stored thereon.

Electro-optic system 502 includes optical sources 504, an optical waveguide 506, RF receiver 214, optical resonant cavity 216, RF receiver 218 and optical resonant cavity 220. In this example, optical sources 504, optical waveguide 506, RF receiver 214, optical resonant cavity 216, RF receiver 218 and optical resonant cavity 220 are illustrated as individual devices. However, in some embodiments, at least two of optical sources 504, optical waveguide 506, RF receiver 214, optical resonant cavity 216, RF receiver 218 and optical resonant cavity 220 may be combined as a unitary device.

A difference in operation between system 500 and system 200 is that in system 500, optical sources 504 provide an optical input signal 520, an optical input signal 522 and an optical input signal 524. Further, optical waveguide 506 provides an optical output signal 526, an optical output signal 528 and an optical output signal 530. This difference will be described in greater detail with reference to FIG. 6.

Figure 6:
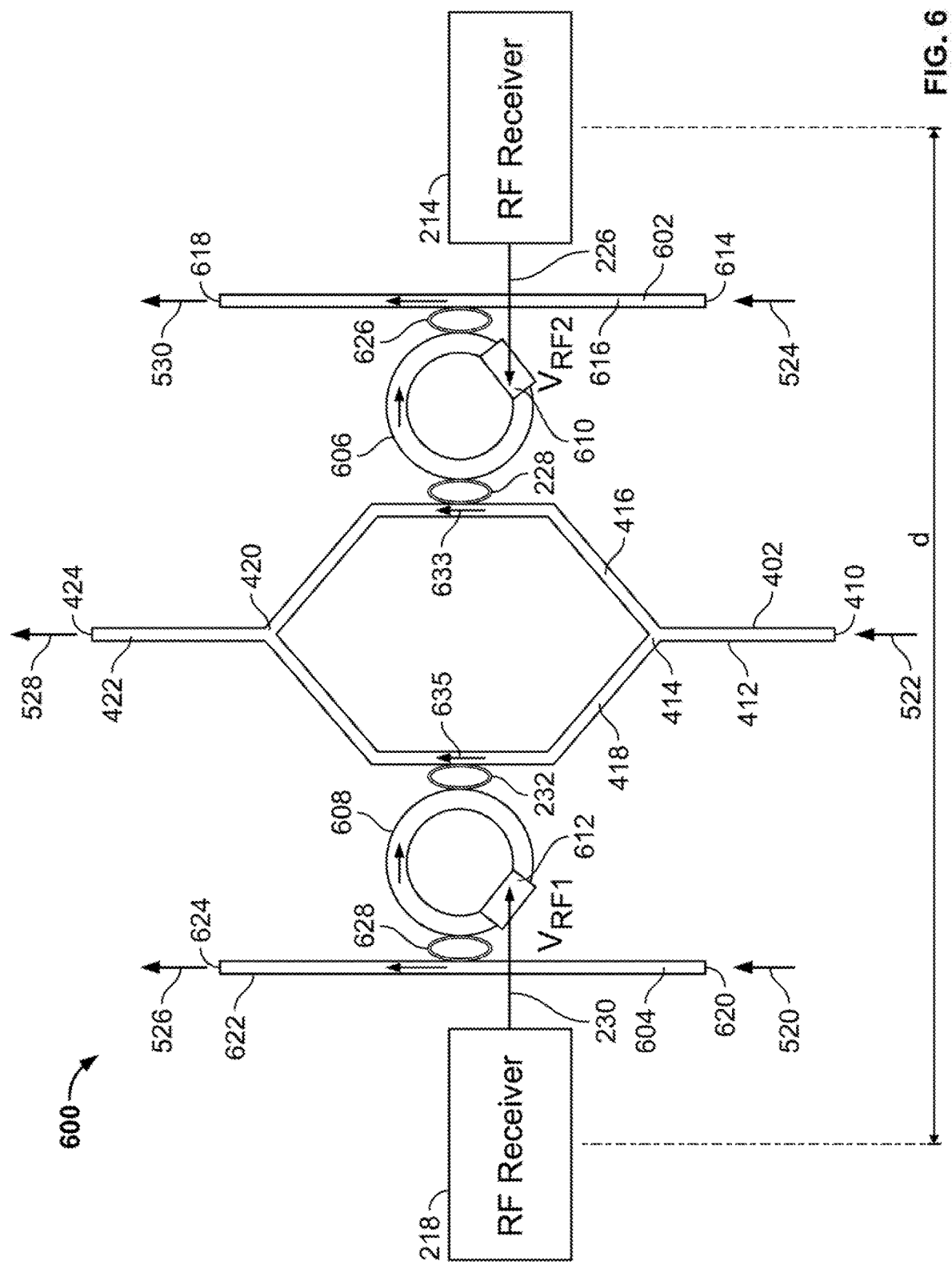
FIG. 6 illustrates a detailed view of an example portion of an example embodiment of the system of FIG. 5.

FIG. 6 illustrates a detailed view of an example portion 600 of an example embodiment of system 500.

As shown in the figure, portion 600 includes RF receiver 214, RF receiver 218, optical waveguide 402, an optical waveguide 602, an optical waveguide 604, an optical resonant cavity 606, an optical resonant cavity 608, an electrode 610 and an electrode 612.

Optical waveguide 602 includes an optical input 614, an optical transmission portion 616 and an optical output 618. Optical transmission portion 616 is disposed between optical input 614 and optical output 618. Optical waveguide 604 includes an optical input 620, an optical transmission portion 622 and an optical output 624. Optical transmission portion 622 is disposed between optical input 620 and optical output 624.

RF receiver 214 is arranged to provide affecting signal 226 to electrode 610, which is disposed on optical resonant cavity 606. Optical resonant cavity 606 is arranged to optically couple with optical waveguide 602 as shown by ellipse 626 and is arranged to optically couple with leg 416 of optical waveguide 402 as shown by ellipse 228.

Each of optical resonant cavities 606 and 608 have a material therein in which an optical property is controllable. Any optical material may be used in accordance with aspects of the present disclosure that is controllably variable. Non-limiting examples of such optical materials include electro-optic materials and magneto-optic materials. Further, in some embodiments, optical resonant cavity 606 has a controllably variable optical material that is different from the controllably variable optical material within optical resonant cavity 608.

In an example embodiment, each of optical resonant cavities 606 and 608 have a non-linear electro-optical material therein. In a specific working example embodiment, each of optical resonant cavities 606 and 608 have $LiNbO_3$, wherein the achievable refractive index change is achieved in the material when an electric field is applied in accordance with the Pockels effect.

Optical resonant cavity 608 is arranged to optically couple with optical waveguide 604 as shown by ellipse 628 and is arranged to optically couple with leg 418 of optical waveguide 402 as shown by ellipse 232.

As shown in FIG. 5, in operation, optical sources 504 provides optical input signals 520, 522 and 524 to optical waveguide 506. After the optical input signal is provided, the first RF signal is received in a manner discussed above with reference to FIG. 2B. As shown in FIG. 6, in operation, RF receiver 214 detects RF signal 202 and outputs affecting signal 226. In one example, affecting signal 226 is a voltage $V_{RF2}$.

After the first RF signal is received, the first cavity is affected. For example, as shown in FIG. 5, optical resonant cavity 216 is affected by affecting signal 226. This will be described in greater detail with reference to FIG. 6.

As shown in FIG. 6, optical input signal 522 enters optical waveguide 402 at optical input 410, transmits through optical transmission portion 412 and is split at beam splitter 414. A portion of optical input signal 224 transmits along leg 416, whereas another portion of optical input signal 224 transmits along leg 418. Further, optical input signal 524 enters optical waveguide 602 at optical input 614 and transmits through optical transmission portion 616, while optical input signal 520 enters optical waveguide 604 at optical input 620 and transmits through optical transmission portion 622.

RF receiver 214 is arranged at a first location to receive RF signal 202 and provide affecting signal 226 to electrode 610. Here, affecting signal 226 takes the form of voltage $V_{RF2}$ on electrode 610, which affects the refractive index of the $LiNbO_3$ within optical resonant cavity 606.

After the first cavity is affected, the second RF signal is received.

As shown in FIG. 6, in operation, RF receiver 218 detects RF signal 202 and outputs affecting signal 230. In this example, affecting signal 230 is a voltage $V_{RF1}$.

After the second RF signal is received, the second cavity is affected. For example, as shown in FIG. 5, optical resonant cavity 220 is affected by affecting signal 230.

As shown in FIG. 6, RF receiver 218 is arranged at a second location to receive RF signal 202 and provide affecting signal 230 to electrode 612. Again, RF receiver 218 is provided at a known, predetermined distance d from RF receiver 214. This known, predetermined distance that separates RF receiver 214 from RF receiver 218 will enable a system in accordance with the present disclosure to accurately determine a direction of RF signal 202.

Affecting signal 230 takes the form of voltage $V_{RF1}$ on electrode 612, which affects the refractive index of the $LiNbO_3$ within optical resonant cavity 608.

After the second cavity is affected, a signal is outputted. As shown in FIG. 6, leg 416 receives the portion optical input signal 522 and couples with optical resonant cavity 606.

Optical resonant cavity portion 426 then recouples with leg 416 and interferes with the portion of optical input signal 522 within leg 416 to generate a modified signal 633 based on the changes as affected by $V_{RF2}$. Modified signal 633 is then transmitted to beam combiner 420.

Similarly, leg 418 receives a portion of optical input signal 522 and couples with optical resonant cavity 608. Optical resonant cavity 608 then recouples with leg 418 and interferes with the portion of optical input signal 522 within leg 418 to generate a modified signal 635 based on the changes as affected by $V_{RF1}$.

Beam combiner 420 combines modified signal 633 with modified signal 635 to generate optical output signal 528, which is transmitted through optical transmission portion 422 and out optical output 424 to opto-electric component 508 (shown in FIG. 5).

While optical input signal 522 enters optical waveguide 402 at optical input 410, optical input signal 524 enters optical waveguide 602 at optical input 614, transmits through optical transmission portion 616 and couples with optical resonant cavity 606 as shown by ellipse 626. Optical resonant cavity 606 then recouples with optical transmission portion 616 and interferes with optical input signal 524 within optical transmission portion 616 to generate optical output signal 530 based on the changes as affected by $V_{RF2}$.

Similarly, while optical input signal 522 enters optical waveguide 402 at optical input 410, optical input signal 520 enters optical waveguide 604 at optical input 620, transmits through optical transmission portion 622 and couples with optical resonant cavity 608 as shown by ellipse 628. Optical resonant cavity 608 then recouples with optical transmission portion 622 and interferes with optical input signal 520 within optical transmission portion 622 to generate optical output signal 526 based on the changes as affected by $V_{RF1}$.

Returning to FIG. 5, opto-electric component 508 may be any device or system that is able to output electrical signal 236 based on output optical signals 526, 528 and 530. A non-limiting example of opto-electric component 508 includes a photodetector that is able to convert output optical signals 526, 528 and 530 into electrical signal 236. Further, opto-electric component 508 compares the phase information in output optical signal 528 with the phase information in output optical signal 526 and the phase information in output optical signal 530 to account for errors in transmission.

Direction component 510 may be any device or system that is able to determine a direction of RF signal 202 based on electrical signal 236.

The non-limiting example embodiment discussed above with reference to FIGS. 2A-6 may be constructed using materials commonly used in electro-optic devices and circuitry. The optical waveguides and resonators may be fabricated using one or more known methods. Other forms of optical resonators may additionally be used within the scope of the present disclosure, non-limiting examples of such other forms of optical resonators include race track resonators. Further, it should be noted that other arrangements of resonant cavities and waveguides may be used within the scope of the present disclosure.

Systems and methods in accordance with aspects of the present disclosure provide higher accuracy and resolution of phase difference measurements than currently possible by direct modulation or one or more arms of existing optical interferometric devices. Furthermore, a system in accordance with aspects of the present disclosure, in addition to being more compact and using lower power than existing devices, may be fully integrated with high-temperature superconducting circuitry and devices when fabricated from $LiNbO_3$. This would enable full integration with high-temperature superconducting array sensors. The combined integrated device, when mounted on a small cryo-cooler, would enable sub-¼ wavelength angle of arrival determination from a single stationary point for multiple frequencies. Such a system, when on a moving platform or in concert with additional devices will enable high accuracy direction finding of a broad range of frequencies, from the HF-EHF bands.

The foregoing description of various preferred embodiments have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A system for use with an optical input signal for detecting a phase difference between a first RF signal having a first phase and a second RF signal having a second phase, said system comprising:
an optical waveguide comprising an optical input, an optical output and an optical transmission portion separating said optical input from said optical output, said optical input being arranged to receive the optical input signal;
a first optical resonant cavity comprising a first non-linear electro-optical material;
a first RF receiver arranged at a first location to receive the first RF signal and being operable to affect said first non-linear electro-optical material of said first optical resonant cavity;
a second optical resonant cavity comprising a second non-linear electro-optical material;
a second RF receiver arranged at a second location to receive the second RF signal and being operable to affect said second non-linear electro-optical material of said second optical resonant cavity,
wherein said optical waveguide is further operable to output an optical output signal based on the optical input signal as modified by said first optical resonant cavity as affected by said first RF receiver receiving the first RF signal and as modified by said second optical resonant cavity as affected by said second RF receiver,
wherein a difference between the optical output signal and the optical input signal is based on a difference between the first phase and the second phase,
wherein a difference between the first phase and the second phase is based on a difference between the first location and the second location,
wherein said optical transmission portion comprises a beam splitter, a first leg, a second leg and a beam combiner,
wherein said beam splitter is disposed between said optical input and said first leg,
wherein said beam combiner is disposed between said first leg and said optical output,
wherein said first optical resonant cavity is arranged at said first leg between said beam splitter and said beam combiner,
wherein said second optical resonant cavity is arranged at said second leg between said beam splitter and said beam combiner, and
wherein said first optical resonant cavity and said second optical resonant cavity are arranged as a cross-ring resonator disposed between said first leg and said second leg.

2. The system of claim 1, further comprising:
an opto-electric component operable to generate an electric signal based on the optical output signal; and
a direction component operable to determine a direction based on the electric signal.

3. The system of claim 1, wherein said first non-linear electro-optical material and said second non-linear electro-optical material are the same non-linear electro-optical material.

4. A method detecting a phase difference between a first RF signal having a first phase and a second RF signal having a second phase, said method comprising:
providing an optical input signal to an optical waveguide comprising an optical input, an optical output and an optical transmission portion separating the optical input from the optical output, the optical input being arranged to receive the optical input signal;
receiving, via a first RF receiver arranged at a first location, the first RF signal;
affecting, via the received first RF signal at the first RF receiver, a first non-linear electro-optical material of a first optical resonant cavity;
receiving, via a second RF receiver arranged at a second location, the second RF signal;
affecting, via the received second RF signal at the second RF receiver, a second non-linear electro-optical material of a second optical resonant cavity;
outputting, via the optical output, an optical output signal based on the optical input signal as modified by the first optical resonant cavity as affected by the first RF receiver receiving the first RF signal and as modified by the second optical resonant cavity as affected by the second RF receiver,
wherein a difference between the optical output signal and the optical input signal is based on a difference between the first phase and the second phase,
wherein a difference between the first phase and the second phase is based on a difference between the first location and the second location;
wherein said providing an optical input signal to an optical waveguide comprises providing the optical input signal to the optical waveguide comprising the optical transmission portion comprising a beam splitter, a first leg, a second leg and a beam combiner,
wherein the beam splitter is disposed between the optical input and the first leg,
wherein the beam combiner is disposed between the first leg and the optical output,
wherein the first optical resonant cavity is arranged at the first leg between the beam splitter and the beam combiner,
wherein the second optical resonant cavity is arranged at the second leg between the beam splitter and the beam combiner, and
wherein the first optical resonant cavity and the second optical resonant cavity are arranged as a cross-ring resonator disposed between the first leg and the second leg.

5. The method of claim 4, further comprising:
generating, via an opto-electric component, an electric signal based on the optical output signal; and
determining, via a direction component, a direction based on the electric signal.

6. The method of claim 5, wherein the first non-linear electro-optical material and the second non-linear electro-optical material are the same non-linear electro-optical material.

7. A system for use with a first optical input signal, a second optical input signal and a third optical input signal for detecting a phase difference between a first RF signal having a first phase and a second RF signal having a second phase, said system comprising:
a first optical waveguide comprising a first optical input, a first optical output and a first optical transmission portion separating said first optical input from said first optical output, said first optical input being arranged to receive the first optical input signal;
a second optical waveguide comprising a second optical input, a second optical output and a second optical transmission portion separating said second optical input from said second optical output, said second optical input being arranged to receive the second optical input signal;

a third optical waveguide comprising a third optical input, a third optical output and a third optical transmission portion separating said third optical input from said third optical output, said third optical input being arranged to receive the third optical input signal;

a first optical resonant cavity comprising a first non-linear electro-optical material;

a first RF receiver arranged at a first location to receive the first RF signal and being operable to affect said first non-linear electro-optical material of said first optical resonant cavity;

a second optical resonant cavity comprising a second non-linear electro-optical material;

a second RF receiver arranged at a second location to receive the second RF signal and being operable to affect said second non-linear electro-optical material of said second optical resonant cavity, wherein said first optical waveguide is further operable to output a first optical output signal based on the first optical input signal as modified by said first optical resonant cavity as affected by said first RF receiver receiving the first RF signal, wherein said second optical waveguide is further operable to output a second optical output signal based on the second optical input signal as modified by said first optical resonant cavity as affected by said first RF receiver receiving the first RF signal and as modified by said second optical resonant cavity as affected by said second RF receiver, wherein said third optical waveguide is further operable to output a third optical output signal based on the third optical input signal as modified by said second optical resonant cavity as affected by said second RF receiver receiving the second RF signal, wherein a difference between the second optical output signal and the second optical input signal is based on a difference between the first phase and the second phase, and wherein a difference between the first phase and the second phase is based on a difference between the first location and the second location.

* * * * *